US006993739B2

(12) United States Patent
Becker et al.

(10) Patent No.: US 6,993,739 B2
(45) Date of Patent: Jan. 31, 2006

(54) METHOD, STRUCTURE, AND COMPUTER PROGRAM PRODUCT FOR IMPLEMENTING HIGH FREQUENCY RETURN CURRENT PATHS WITHIN ELECTRONIC PACKAGES

(75) Inventors: Darryl John Becker, Rochester, MN (US); Daniel Douriet, Round Rock, TX (US); Matthew Stephen Doyle, Rochester, MN (US); Andrew B. Maki, Rochester, MN (US); Joel David Ziegelbein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 10/682,135

(22) Filed: Oct. 9, 2003

(65) Prior Publication Data

US 2005/0086623 A1   Apr. 21, 2005

(51) Int. Cl.
*G06F 17/50* (2006.01)
(52) U.S. Cl. .................. 716/10; 718/1; 718/8
(58) Field of Classification Search .......... 716/10, 716/1, 8
See application file for complete search history.

(56) References Cited

OTHER PUBLICATIONS

Hubing et al., "Identifying and Quantifying Print Circuit Board Inductance", Aug. 1994, IEEE International Symposium on Electromagnetic Compatibility, Symposium Record pp. 205-208.*
Chen et al., "Via and Return Path Discontinuity Impact to High Speed Digital Signal Quality", Oct. 2000, IEEE Conference on Electrical Performance of Electronic Packaging, Digest, pp. 215-218.*
Pak et al., "Prediction and Verification of Power/Ground Plane Edge Radiation Excited by Through-Hole Signal Via Based on Balanced TLM and Via Coupling Model", Oct. 2003, IEEE Conference on Electrical Performance of Electronic Packaging, pp. 181-184.*

* cited by examiner

*Primary Examiner*—Sun James Lin
(74) *Attorney, Agent, or Firm*—Joan Pennington

(57) ABSTRACT

A method, structure and computer program product are provided for implementing high frequency return current paths within electronic packages. Electronic package physical design data is received for identifying a design layout. For each of a plurality of cells in a grid of a set cell size within the identified design layout, a respective number of signal vias, reference voltage vias, and ground vias are identified. A signal to reference via ratio is calculated for each of the plurality of cells. Each cell having a calculated signal to reference via ratio greater than a target ratio is identified. Vias are selectively added within each of the identified cells for providing high frequency return current paths.

18 Claims, 3 Drawing Sheets

METHOD, STRUCTURE, AND COMPUTER PROGRAM PRODUCT FOR IMPLEMENTING HIGH FREQUENCY RETURN CURRENT PATHS WITHIN ELECTRONIC PACKAGES

FIELD OF THE INVENTION

The present invention relates generally to the data processing field, and more particularly, relates to a method, structure and computer program product for implementing high frequency return current paths within electronic packages.

DESCRIPTION OF THE RELATED ART

Electronic packages typically include multiple layers or planes including multiple signal, voltage and ground planes. In high speed package design, closing the return current path of signals that change wiring planes is a key concern to guarantee proper signal integrity. When a high speed signal is traveling down a trace sandwiched between two reference planes, a return current is induced on the adjacent planes.

When the signal changes wiring layers through a via, the return current needs a low inductance path through which it can track the signal. If an adequate path is not supplied for the return current, then signal degradation occurs due to the inductive nature of the added path. Depending on the rise time of the signal, the return current path is required to be electrically close to where the signal changes planes.

Current solutions to this problem include a time consuming process of visual inspection or complicated full-wave simulation of the entire design. This costs time and money, especially when designing many high speed packages at one time. Additionally, visually inspecting a complex design is subjective and error prone.

A need exists for a mechanism for implementing high frequency return current paths within electronic packages.

SUMMARY OF THE INVENTION

A principal object of the present invention is to provide a method, structure and computer program product for implementing high frequency return current paths within electronic packages. Other important objects of the present invention are to provide such a method, structure and computer program product for implementing high frequency return current paths within electronic packages substantially without negative effect and that overcome many of the disadvantages of prior art arrangements.

In brief, a method, structure and computer program product are provided for implementing high frequency return current paths within electronic packages. Electronic package physical design data is received for identifying a board layout. For each of a plurality of cells in a grid of a set cell size within the identified board layout, a respective number of signal vias, reference voltage vias, and ground vias are identified. A signal to reference via ratio is calculated for each of the plurality of cells. Each cell having a calculated signal to reference via ratio greater than a target ratio is identified. Vias are selectively added within each of the identified cells to provide high frequency return current paths.

In accordance with features of the invention, the electronic package physical design data includes stack-up data for identifying reference voltages residing on multiple planes and reference voltages referenced by high speed nets; a board file for identifying locations of high speed nets, locations of plane change vias, and board dimensions; and a net list for creating a list of all reference voltages. The target ratio is selected by a user and is equal to a maximum desired signal to reference via ratio.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
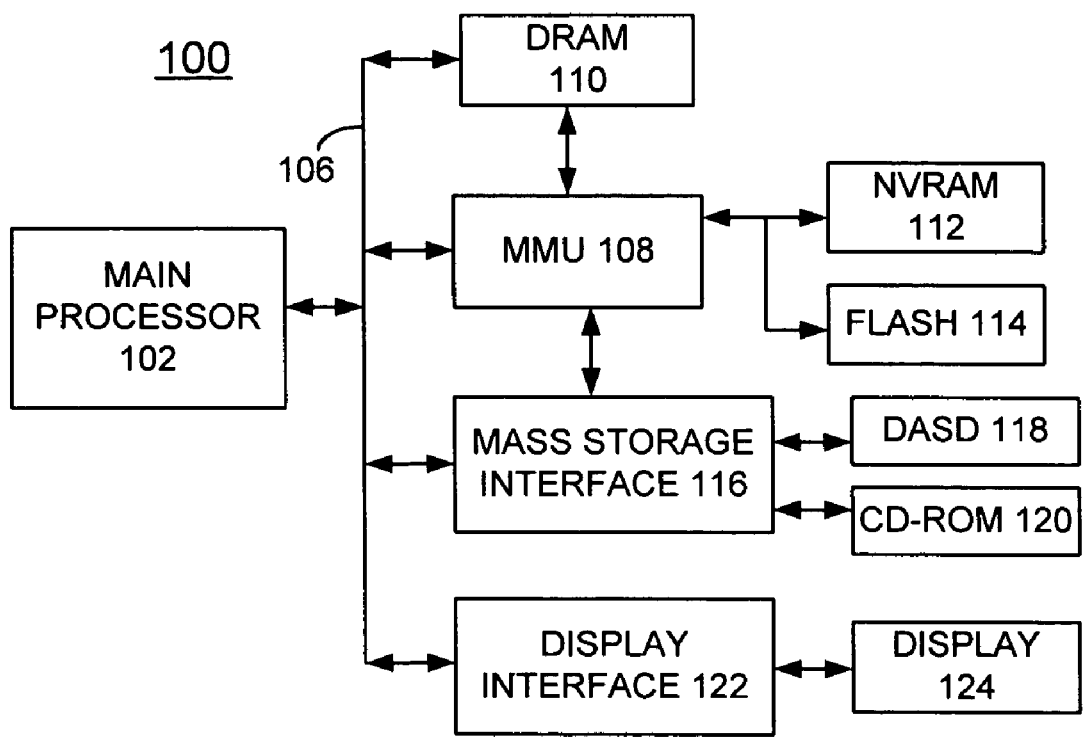
FIGS. 1 and 2 are block diagram representations illustrating a computer system and operating system for implementing methods for implementing high frequency return current paths within electronic packages in accordance with the preferred embodiment.
Figure 2:
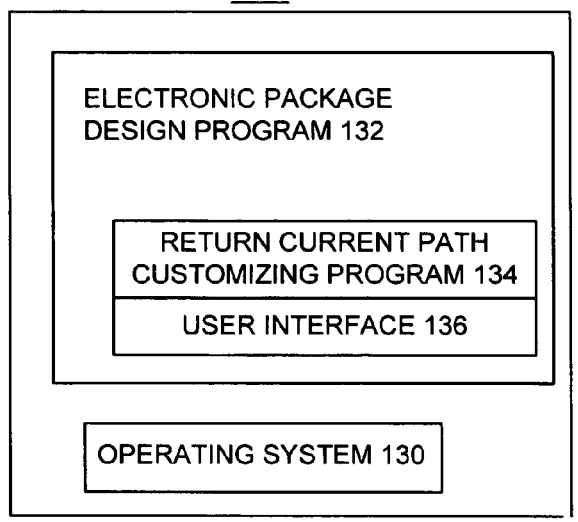

Referring now to the drawings, in FIGS. 1 and 2 there is shown a computer system generally designated by the reference character 100 for implementing high frequency return current paths within electronic packages in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an electronic package design program 132, a return current path customizing program 134 of the preferred embodiment, and a user interface 136.

Various commercially available computers can be used for computer system 100, for example, an IBM personal computer. CPU 102 is suitably programmed by the return current path customizing program 134 to execute the flowchart of FIG. 3 for implementing high frequency return current paths within electronic packages in accordance with the preferred embodiment.

In accordance with features of the preferred embodiment, a method is provided for identifying and resolving insufficient return current path locations in any type of package design in a minimal amount of time and effort, and in a consistent and reproducible manner. A systematic, computer-automated approach is used to analyze design files, interpret the outputs, and to construct a final electronic package design including customized return current paths that optimizes return current paths and maintains signal integrity.

Figure 3:
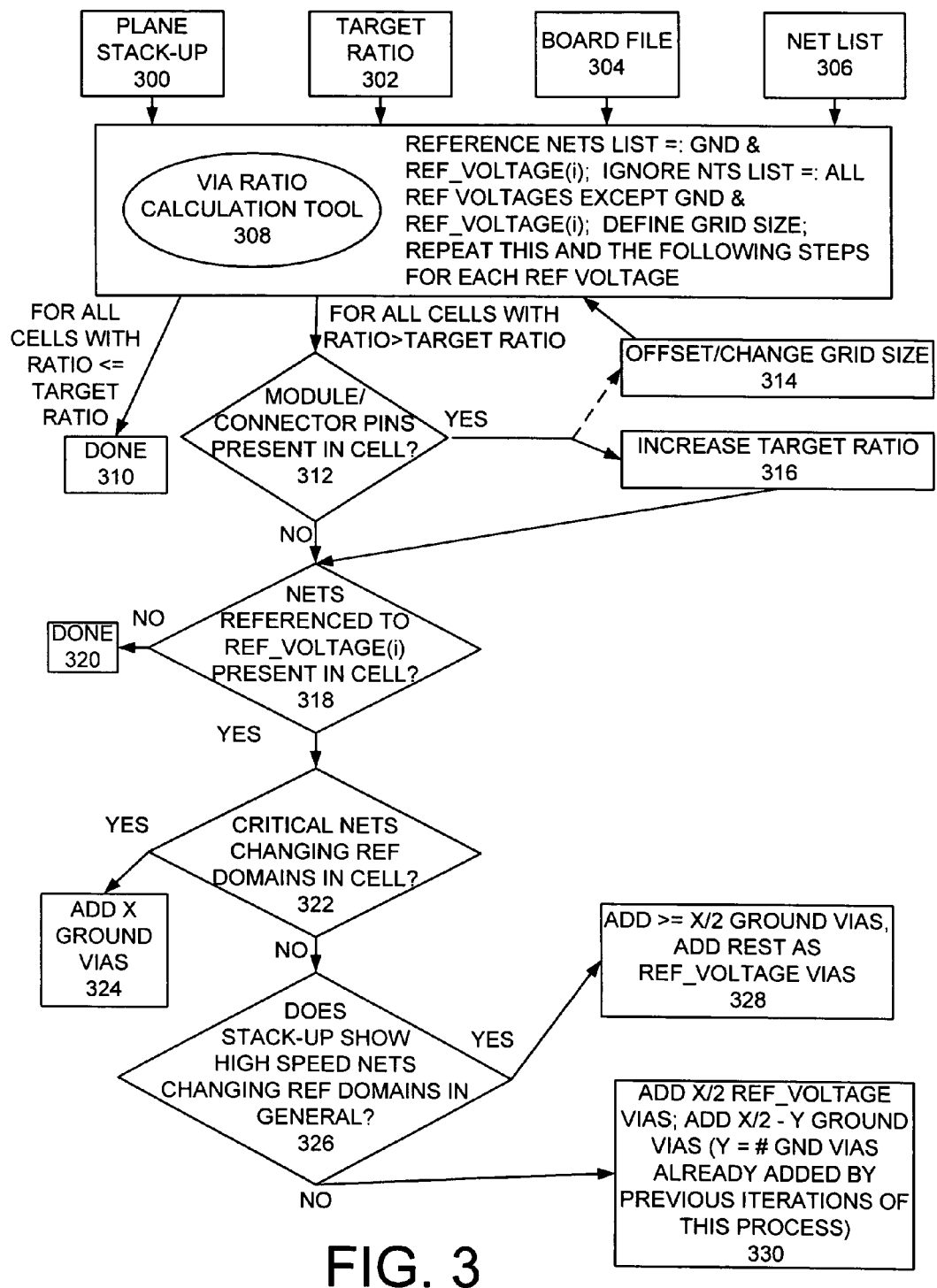
FIG. 3 is a flow chart illustrating exemplary steps for implementing high frequency return current paths in accordance with the preferred embodiment.

FIG. 3 illustrates the process of the preferred embodiment, drawing on interface requirements and design files as inputs. The method of the preferred embodiment provides a significant advantage of a consistent and concise way to analyze many different designs, including cards and first level packages to rapidly construct an electronic package design with optimized return current paths and signal integrity.

Referring now to FIG. 3, there are shown exemplary steps for implementing high frequency return current paths in accordance with the preferred embodiment. Electronic package physical design data is received, reference voltages residing on multiple planes are identified, and reference voltages referenced by high speed nets are identified from a plane stack-up block 300. A target ratio equal to a maximum signal to reference via ratio is identified at a target ratio block 302. A determination is made of locations of high speed nets, locations of plane change vias, and board dimensions from a board file as indicated in a block 304. A list of all reference voltages is created from a net list block 306. A via ratio calculation tool 308 receiving inputs from blocks 300, 302, 304, and 306, creates a reference nets list of all ground and reference voltages GND & REF_VOLTAGE(i), an ignore nets list of all reference voltages except GND & REF_VOLTAGE(i), and defines a grid size. The reference nets list of all ground and reference voltages GND & REF_VOLTAGE(i) includes each ground and voltage plane adjacent to a signal plane.

The via ratio calculation tool 308 determines the number of signal and reference vias within a specified cell size or board region. The reference vias within the specified cell size or board region can include only ground vias, only voltage vias or both voltage vias and ground vias. Based on the relative density of signal to reference vias, the via ratio calculation tool 308 calculates a qualitative figure of merit for each cell. As a result, cells that have a deficient signal return path or a calculated via ratio greater than the target ratio are identified for further processing. The user then uses this ratio as input to the remaining steps in the flow chart to determine what action must be taken. This action optimizes return current paths in a design and ensures signal integrity of all switching signals without significantly impacting design time. For cells that have an adequate signal return path or a ratio less than or equal to the target ratio, no further processing is needed as indicated in a block 310.

For all cells with a ratio greater than the target ratio, checking for module or connector pins present in the cell is performed as indicated in a decision block 312. Any module or connector pins present in the cell may also provide return current paths. When module or connector pins are present in the cell, then the grid size or offset optionally is changed as indicated in a block 314 and calculations are repeated by the via ratio calculation tool 308 with the changed grid size. Alternatively, the target ratio optionally is changed as indicated in a block 316. The user determines the required target ratio at block 316 and cell size at block 314 for each interface or critical signals depending on design margins. Adding vias for cells that have a deficient signal return path can be accomplished through an automated or systematic approach with further processing as shown in FIG. 3.

When module or connector pins are not present in the cell or after the target ratio is increased at block 316, then checking for nets referenced to REF_VOLTAGE(i) present in the cell is performed as indicated in a decision block 318.

When signal nets referenced to REF_VOLTAGE(i) are not present in the cell, then no further processing is needed as indicated in a block 320. When signal nets referenced to REF_VOLTAGE(i) are present in the cell, then checking for critical nets changing reference domains present in the cell is performed as indicated in a decision block 322. Critical nets changing reference domains include signal changes from one plane to another plane with a different reference voltage, for example, from one plane with an adjacent 1.8 voltage reference plane to another plane with an adjacent 1.2 voltage reference plane. When critical nets changing reference domains are present in the cell, then a number X of ground vias are added to the cell as indicated in a block 324. When critical nets changing reference domains are not present in the cell, then checking whether the stack-up shows high speed nets changing reference domains in general is performed as indicated in a decision block 326. When the stack-up shows high speed nets changing reference domains in general, then a number X/2 of ground vias are added to the cell and the rest are added to the cell as REF_VOLTAGE vias as indicated in a block 328. When the stack-up does not show high speed nets changing reference domains in general, then a number X/2 of REF_VOLTAGE vias are added to the cell and a number of X/2-Y ground vias are added to the cell, where Y equals the number of ground vias already added to the cell by previous iterations of this process as indicated in a block 330. This process is repeated for each cell having a ratio greater than the target ratio.

Figure 4:
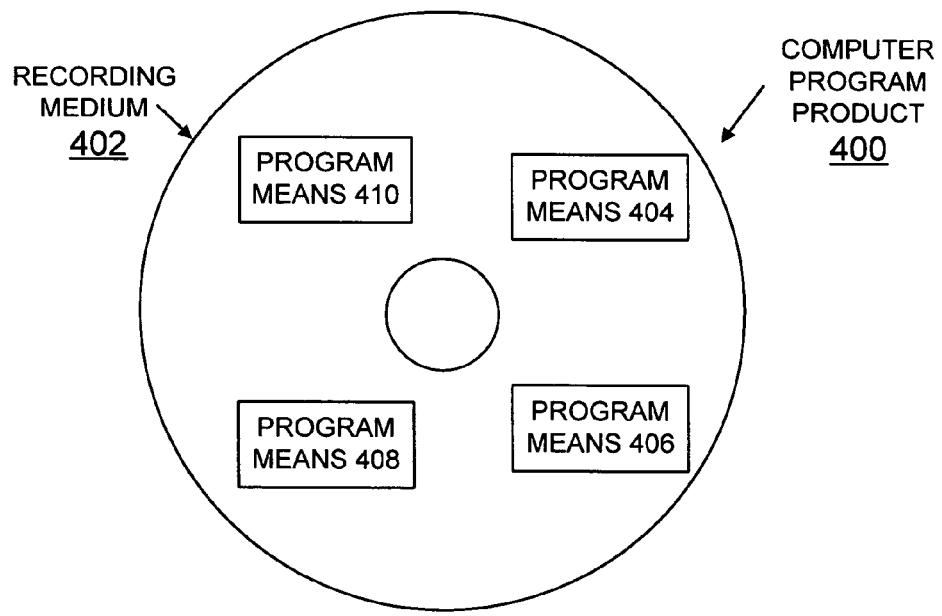
FIG. 4 is a block diagram illustrating a computer program product in accordance with the preferred embodiment.

Referring now to FIG. 4, an article of manufacture or a computer program product 400 of the invention is illustrated. The computer program product 400 includes a recording medium 402, such as, a floppy disk, a high capacity read only memory in the form of an optically read compact disk or CD-ROM, a tape, a transmission type media such as a digital or analog communications link, or a similar computer program product. Recording medium 402 stores program means 404, 406, 408, 410 on the medium 402 for carrying out the methods for implementing high frequency return current paths within electronic packages of the preferred embodiment in the system 100 of FIG. 1.

A sequence of program instructions or a logical assembly of one or more interrelated modules defined by the recorded program means 404, 406, 408, 410, direct the computer system 100 for implementing high frequency return current paths within electronic packages of the preferred embodiment.

While the present invention has been described with reference to the details of the embodiments of the invention shown in the drawing, these details are not intended to limit the scope of the invention as claimed in the appended claims.

What is claimed is:

1. A method for implementing high frequency return current paths within electronic packages comprising the following steps:

receiving electronic package physical design data for identifying a design layout;

utilizing said identified design layout for identifying a respective number of signal vias, reference voltage vias, and ground vias for a plurality of cells in a grid of a set cell size within said identified design layout;

calculating a signal to reference via ratio for each of said plurality of cells;

identifying each cell having said calculated signal to reference via ratio greater than a target ratio; and selectively adding vias within each said identified cell for providing high frequency return current paths.

2. The method for implementing high frequency return current paths within electronic packages as recited in claim 1 wherein the step of receiving electronic package physical design data for identifying said design layout includes a step of receiving plane stack-up data for identifying reference voltages residing on multiple planes and reference voltages referenced by high speed nets.

3. The method for implementing high frequency return current paths within electronic packages as recited in claim 1 wherein the step of receiving electronic package physical design data for identifying said design layout includes a step of receiving a board file for identifying locations of high speed nets, locations of plane change vias, and board dimensions.

4. The method for implementing high frequency return current paths within electronic packages as recited in claim 1 wherein the step of receiving electronic package physical design data for identifying said design layout includes a step of receiving a net list for creating a list of all reference voltages.

5. The method for implementing high frequency return current paths within electronic packages as recited in claim 1 includes further a step of receiving a user selected value for said target ratio wherein said target ratio defining a maximum signal to reference via ratio.

6. The method for implementing high frequency return current paths within electronic packages as recited in claim 1 wherein the step of utilizing said identified design layout for identifying a respective number of signal, reference voltage, and ground vias for a plurality of cells in a grid of a set cell size within said identified design layout includes steps of defining a reference nets list including each ground plane and each reference voltage plane adjacent to a signal plane; and defining said grid for a specified cell size.

7. The method for implementing high frequency return current paths within electronic packages as recited in claim 1 wherein the step of calculating a signal to reference via ratio for each of said plurality of cells includes a step of identifying a user selected cell size.

8. The method for implementing high frequency return current paths within electronic packages as recited in claim 1 wherein the step of identifying each cell having said calculated signal to reference via ratio greater than a target ratio includes a step of identifying a user selected target ratio.

9. The method for implementing high frequency return current paths within electronic packages as recited in claim 1 wherein the step of selectively adding vias within each said identified cell for providing high frequency return current paths is responsive to identifying nets referenced to reference voltages within each said identified cell.

10. The method for implementing high frequency return current paths within electronic packages as recited in claim 9 further includes steps of identifying critical nets changing reference domains within said cell; and adding a number of ground vias.

11. The method for implementing high frequency return current paths within electronic packages as recited in claim 9 further includes the steps of identifying a threshold number of high speed nets changing reference domains within said design layout; adding a number of ground vias; and adding a number of reference voltage vias.

12. The method for implementing high frequency return current paths within electronic packages as recited in claim 9 further includes steps of adding a number of reference voltage vias and adding a selected number of ground vias.

13. The method for implementing high frequency return current paths within electronic packages as recited in claim 1 wherein the step of selectively adding vias within each said identified cell to provide high frequency return current paths includes steps of identifying a user selected target ratio and a user selected cell size; and selectively adding one or more of a number of ground vias and a number of reference voltage vias.

14. A customized return current path structure for an electronic package utilizing an initial design layout created by identifying a respective number of signal vias, reference voltage vias, and ground vias for a plurality of cells in a grid of a set cell size within the initial design layout; calculating a signal to reference via ratio for each of said plurality of cells; and identifying each cell having said calculated signal to reference via ratio greater than a target ratio, said customized return current path structure comprising:
  for each of the identified cells having said calculated signal to reference via ratio greater than said target ratio and having critical nets changing reference domains within said identified cell, a number of ground vias added; and
  for each of the identified cells having said calculated signal to reference via ratio greater than said target ratio and without critical nets changing reference domains within said identified cell, a number of ground vias added and a number of reference voltage vias added.

15. A computer program product for implementing high frequency return current paths within electronic packages in a computer system, said computer program product including instructions executed by the computer system to cause the computer system to perform the following steps:
  receiving electronic package physical design data for identifying a design layout;
  utilizing said identified design layout for identifying a respective number of signal vias, reference voltage vias, and ground vias for a plurality of cells in a grid of a defined cell size within said identified design layout;
  calculating a signal to reference via ratio for each of said plurality of cells;
  identifying each cell having said calculated signal to reference via ratio greater than a target ratio; and
  selectively adding vias within each said identified cell for providing high frequency return current paths to create a final design layout.

16. A computer program product for implementing high frequency return current paths within electronic packages as recited in claim 15 further includes steps of: receiving a first user selected value for said target ratio wherein said target ratio defining a maximum signal to reference via ratio; and user receiving a second selected value for said defined cell size.

17. A computer program product for implementing high frequency return current paths within electronic packages as recited in claim 15 wherein the step of selectively adding vias within each said identified cell for providing high frequency return current paths to create final design layout includes steps of identifying critical nets changing reference domains within said cell; and adding a number of ground vias.

18. A computer program product for implementing high frequency return current paths within electronic packages as recited in claim 15 wherein the step of selectively adding vias within each said identified cell for providing high frequency return current paths to create a final design layout includes steps of identifying a threshold number of high speed nets changing reference domains within said design layout; adding a number of ground vias; and adding a number of reference voltage vias.

* * * * *